July 26, 1960 A. K. JENSEN 2,946,898

BISTABLE TRANSISTOR CIRCUIT

Filed June 13, 1956

INVENTOR
ALAN K. JENSEN

BY Alfred B. Freeman
AGENT 2,946,898

BISTABLE TRANSISTOR CIRCUIT

Alan K. Jensen, Kenvil, N.J., assignor to Monroe Calculating Machine Company, Orange, N.J., a corporation of Delaware Filed June 13, 1956, Ser. No. 591,226
2 Claims. (Cl. 307—88.5)

This invention relates to a circuit having two stable states and more particularly to a bistable transistor circuit which is interchangeable with a similar type of bistable vacuum tube circuit and which has an improved means for providing a delay between its input and output.

The bistable circuit of the instant invention is the type which will be set to one condition by an input applied to one terminal and to the other condition by an input applied to another terminal. The circuit of the instant invention further is one which interposes a delay between the receipt of an input and the production of an output responsive to the input. This delay eliminates ambiguities and equivocation in the particular one of two stable states to which the circuit is set by an applied input. Thus, a change in condition of one circuit stage caused by a change in the other stage is not regeneratively coupled back to that first stage; thus, to defeat a desired shift in circuit condition.

This type of circuit is used in equipment such as digital computers employing single-phase clock pulses. When a full set of interchangeable transistor circuits is available, equipment with plug-in units can be converted from vacuum tube circuits to transistor circuits merely by substituting plug-in units and changing the power supply voltages. Equipment using interchangeable transistor circuits could also be designed with the same logic as used for designs with vacuum tube circuits.

In order to be interchangeable with a vacuum tube circuit of this type, the transistor circuit must be able to operate in response to an input from a high impedance source and must produce an output that will drive a low impedance load. It must further be able to operate at a high rate of speed and be able to introduce a delay of suitable magnitude between its input and output.

An object of this invention is a bistable transistor circuit which can be interchanged with similar vacuum tube circuits in equipment without change other than in the voltage supply circuits.

A further object of this invention is a bistable transistor circuit which is interchangeable with similar vacuum tube circuits and which will equal or exceed the vacuum tube circuit in speed of operation, driving capability, permissible range of variation of input signal, and power supply variations.

A still further object of this invention is a bistable circuit with an improved means for providing a delay between its input and output.

Other objects and advantages and a fuller understanding of the invention may be had by referring to the following description and claims taken in conjunction with the accompanying drawings in which:

Figure 1:
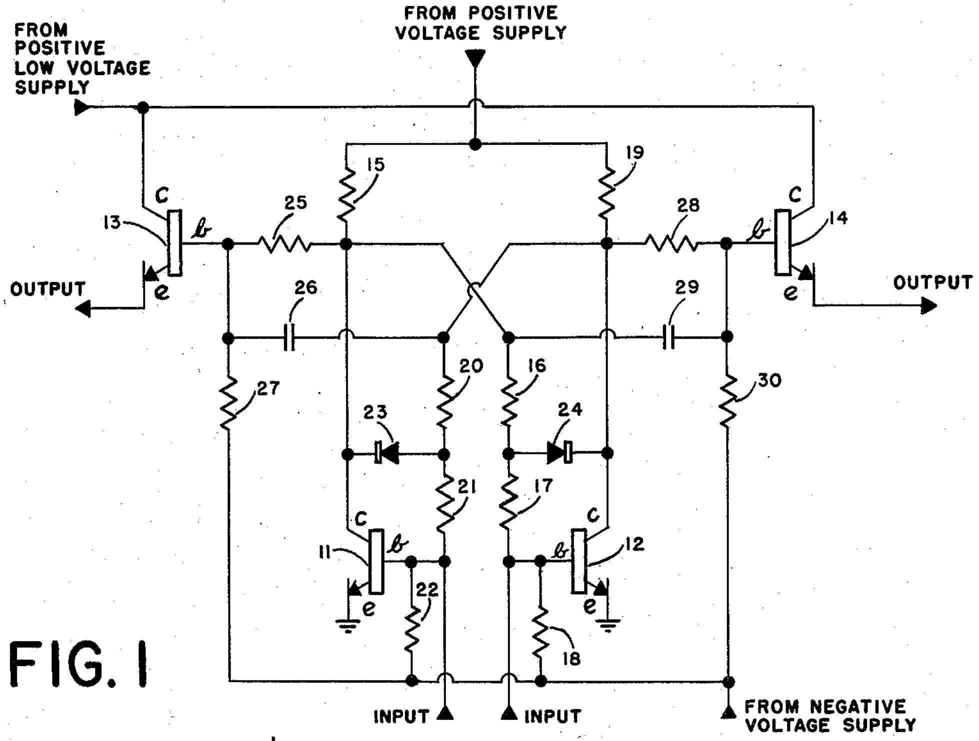
Fig. 1 is a schematic diagram of the circuit comprising an embodiment of this invention.

Referring now to Fig. 1, transistors 11, 12, 13 and 14 each have a base *b*, a collector *c* and an emitter *e*.

Transistors 11 and 12 function as the switching circuit and transistors 13 and 14 as output current amplifiers. The switching circuit requires a negative input to its conducting side to change its state. A delay, which will be described later, is interposed between a change of state of the switching circuit and a corresponding change of state of the output amplifiers. Transistors 11 and 12 should have fast response characteristics and transistors 13 and 14 should have high current gain characteristics. The circuit shown uses transistors of the NPN type, which is described in U.S. Patent No. 2,569,347. It will be obvious to those skilled in the art, however, that the circuit could be adapted to operate with other types as well.

Figure 2:
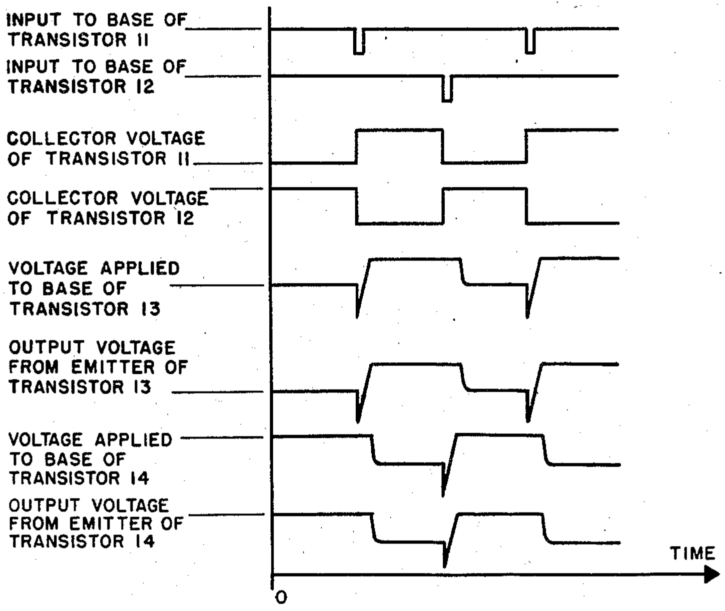
Fig. 2 is a graphical representation of the operating waveforms appearing at key points of the circuit.

Assuming that transistor 11 is conducting and transistor 12 is cut off, the voltages on their bases *b* and collectors *c* will be as shown for time "0" in Fig. 2. The collector *c* of transistor 11 will be near ground potential due to the voltage drop across collector load resistor 15. The negative supply voltage is applied across the voltage divider formed by resistors 16, 17 and 18 so that the base *b* of transistor 12 at the junction of resistors 17 and 18 will be held negative to maintain cut off. As transistor 12 is cut off, its collector *c* will be at a relatively high positive voltage. Current will flow through the voltage divider formed by resistors 19, 20, 21 and 22 between the positive and negative voltage supplies and will hold the base *b* of transistor 11 sufficiently positive to maintain transistor 11 in a conducting state.

Rectifier 23 which may be of the point contact crystal type keeps transistor 11 from being driven into saturation by conducting when the voltage on its collector *c* falls below that at the junction of resistors 20 and 21. This keeps the base *b* of transistor 11 more negative than the collector *c* as there will always be a voltage drop across resistor 21 due to current through base *b* and through resistor 22. Base *b* can thus go more positive than a value which will produce saturation only during the time required for collector *c* current to build up. A high drive can thus be applied to base *b* to turn on transistor 11 fast, and this drive will then quickly be reduced to hold transistor 11 short of saturation.

A negative input voltage pulse applied to its base *b* will reduce conduction in transistor 11. This will raise the voltage on its collector *c* and drive base *b* of transistor 12 more positive. Transistor 12 will start to conduct and the voltage on its collector *c* will drop and drive the voltage on base *b* of transistor 11 further negative. This process continues rapidly until transistor 11 is cut off and transistor 12 is conducting heavily. The conditions of transistors 11 and 12 are then reversed and will remain so until a negative voltage pulse is applied to the input of transistor 12 to return transistors 11 and 12 to their initial conditions in the same manner as for the previous change.

Rectifier 24 prevents transistor 12 from becoming saturated in the same manner as rectifier 23 does with transistor 11. As transistors 11 and 12 are held short of saturation by rectifiers 23 and 24 respectively during the time input signals may be received, they can respond very quickly and so accomplish the switching action in a very short time. Resistors 16 and 18 and resistors 20 and 22 have relatively high values to avoid loading on the input pulses by the voltage dividers. As the input pulses are negative, the bases *b* of transistors 11 and 12 will also offer a relatively high impedance to their respective inputs. A sufficient drive to initiate switching can thus be obtained from a high impedance source.

Resistor 25 and condenser 26 connect collectors *c* of transistors 11 and 12 respectively to base *b* of transistor 13. With transistor 11 conducting, transistor 12 cut off, and condenser 26 already charged, the voltage on base *b* of transistor 13 will be at some negative value. This is due to the voltage drop across the voltage divider formed by resistors 25 and 27 which is connected between collector *c* of transistor 11 and the negative voltage supply. When transistors 11 and 12 reverse their conduction states, base *b* of transistor 13 will be driven further negative due to the drop of potential on collector *c* of transistor 12 which is instantaneously effective through condenser 26. The voltage will then rise to a positive value as condenser 26 charges through resistors 15 and 25 toward the positive voltage now present on collector *c* of transistor 11.

The voltage rise on base *b* of transistor 13 will be limited to the value of the positive low voltage applied to its collector *c*. This happens because transistor 13 will effectively short out any further rise by conducting like a diode between its base *b* and collector *c* when base *b* becomes more positive than collector *c*. When transistors 11 and 12 again reverse states, the rising positive voltage on collector *c* of transistor 12 will be applied through condenser 26. No change will appear on base *b* of transistor 13 as condenser 26 charges initially through base *b* and collector *c* of transistor 13.

Transistor 13 was already saturated and the positive peak through condenser 26 will increase the excess charge and so the degree of saturation. This saturation charge will hold base *b* of transistor 13 positive and will require an appreciable time to dissipate. When it is dissipated, condenser 26 will continue to charge negatively. Condenser 26 charges through resistor 25 and through base *b* and emitter *e* of transistor 13 and the output load. As the output load resistance and the base *b* to emitter *e* resistance of transistor 13 are relatively small, the charging rate will be relatively fast and cause the negative going portion of the waveform to be steep.

The voltage waveform appearing on base *b* of transistor 13 is shown in Fig. 2. This waveform is delayed with respect to the change of states of transistors 11 and 12 due to the time required to charge condenser 26 and to dissipate the saturation charge on transistor 13. Connecting condenser 26 to collector *c* of transistor 12 instead of to a fixed voltage point makes it possible to use a smaller condenser 26 for a given delay and so obtain a steeper waveform. It also provides an interval during which the output voltage is more negative than the steady state negative value before it goes positive and an interval during which the output voltage stays positive before it goes negative.

This type of delay is considerably better for many applications than the steadily and more slowly rising waveform which would be obtained if condenser 26 were returned to ground as is normally done. In computers employing single-phase clock pulses, for example the input to transistors 11 and 12 may also be sensing or controlling other stages in accordance with the output from transistor 13. By making the more negative going portion of the output waveform of transistor 13 and the interval before a change from a positive value wider than the input pulses, the condition of the stages being simultaneously sensed or controlled will not be adversely affected until after the input pulse has terminated. Thereafter, the change of condition will occur more rapidly and at a more definite time so that input pulses can be applied at a faster rate.

Emitter *e* of transistor 13 will be connected to an output load which is biased negatively similarly to the input to transistors 11 and 12. The emitter *e* of transistor 13 is capable of supplying a relatively large current and follows the voltage on the base *b*. Transistor 14 functions with resistor 28, condenser 29 and resistor 30 in the same manner as transistor 13 functions with resistor 25, condenser 26 and resistor 27. Resistor 28 and condenser 29 are connected to transistors 11 and 12 oppositely to resistor 25 and condenser 26 so that the output of transistor 14 is opposite in polarity to that of transistor 13.

What is claimed is:

1. A bistable transistor circuit which comprises, a first and a second transistor, each of said transistors having a base, a collector and an emitter electrode, a source of electric potential providing different potentials at three points, a pair of load resistors respectively connecting said collector electrodes to a first point on said potential source, two pairs of serially connected coupling resistors, said pairs respectively connecting the collector electrode of one of said transistors to the base electrode of the other one of said transistors, a pair of bias resistors, each resistor of said last named pair being respectively connected between said base electrodes and a second potential point of said source, means for connecting said emitter electrodes to a third potential point on said source, said third point having a potential intermediate the potentials of said first and second potential points, a pair of unilaterally conducting devices, the devices of said last named pair being respectively connected between the collector electrode of one of said transistors and a terminal common to the resistors of the coupling resistor pair having one terminal connected to the base electrode of said last mentioned transistor, an output amplifier, a resistor connecting one of said collector electrodes to the input of said amplifier and a capacitor connecting the other of said collector electrodes to the input of said amplifier.

2. Apparatus as set forth in claim 1 wherein said output amplifier comprises a third transistor, the base electrode of said third transistor being connected for receiving signals through said last mentioned resistor and through said last mentioned capacitor.

References Cited in the file of this patent

UNITED STATES PATENTS

| | | |
|---|---|---|
| 2,566,154 | Aicardi | Aug. 28, 1951 |
| 2,737,587 | Trousdale | Mar. 6, 1956 |
| 2,787,712 | Priebe et al. | Apr. 2, 1957 |
| 2,823,856 | Booth et al. | Feb. 18, 1958 |
| 2,831,986 | Sumner | Apr. 22, 1958 |
| 2,879,412 | Hoge et al. | Mar. 24, 1959 |
| 2,882,424 | Wohr | Apr. 14, 1959 |
| 2,884,544 | Warnock | Apr. 23, 1959 |

OTHER REFERENCES

"Nonsaturating Pulse Circuits Using Two Junction Transistors" by J. G. Linvill, July 1955 Proc. of the IRE, pp. 826–833.

"Transistor Circuits for Digital Computers" by D. E. Deuitch, Electronics May 1956, vol. 29, No. 5, pp. 160–161.

Proceedings, Symposium on the Application of Transistors to Military Electrons Equipment, sponsored by the Office of Secretary of Defense, September 1953, article by A. William Carlson, pp. 299–321 entitled, High Speed Non-Saturating Flip-Flops.